US012707649B2

(12) United States Patent
Kumar et al.

(10) Patent No.: US 12,707,649 B2
(45) Date of Patent: Aug. 11, 2026

(54) STACKED 3D CACHE CONFIGURATION WITH ON-CHIP POWER SUPPORT

(71) Applicant: International Business Machines Corporation, Armonk, NY (US)

(72) Inventors: Arvind Kumar, Chappaqua, NY (US); Todd Edward Takken, Brewster, NY (US); John W Golz, Hopewell Jct, NY (US); Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 17/987,823

(22) Filed: Nov. 15, 2022

(65) Prior Publication Data

US 2024/0162192 A1 May 16, 2024

(51) Int. Cl.

| | |
|---|---|
| ***H10B 80/00*** | (2026.01) |
| ***H10W 72/20*** | (2026.01) |
| ***H10W 90/00*** | (2026.01) |
| ***H10W 90/20*** | (2026.01) |
| ***H10W 90/26*** | (2026.01) |

(52) U.S. Cl.

CPC ............ *H10B 80/00* (2023.02); *H10W 90/00* (2026.01); *H10W 72/20* (2026.01); *H10W 90/26* (2026.01); *H10W 90/288* (2026.01); *H10W 90/297* (2026.01); *H10W 90/722* (2026.01)

(58) Field of Classification Search

CPC .... H10B 80/00; H10W 90/26; H10W 90/267; H10W 90/722

See application file for complete search history.

(56) References Cited

U.S. PATENT DOCUMENTS

| | | | | |
|---|---|---|---|---|
| 8,276,002 | B2 | 9/2012 | Dennard | |
| 8,686,559 | B2 * | 4/2014 | Bernstein | H10W 90/00 257/E21.526 |
| 8,710,676 | B2 | 4/2014 | Chou | |
| 8,913,443 | B2 | 12/2014 | Pyeon | |
| 9,251,868 | B2 | 2/2016 | Fukushi | |
| 9,520,779 | B2 | 12/2016 | Andry | |
| 9,921,640 | B2 | 3/2018 | Zillmann | |
| 10,079,489 | B2 | 9/2018 | Droege | |
| 11,239,167 | B2 | 2/2022 | Farooq | |

(Continued)

FOREIGN PATENT DOCUMENTS

| | | |
|---|---|---|
| EP | 3288076 B1 | 6/2021 |

OTHER PUBLICATIONS

Brookwood Nathan. "EPYC: A Study in Energy Efficient CPU Design", Insight 64, 2018, 10 pages.

(Continued)

*Primary Examiner* — David A Zarneke

(74) *Attorney, Agent, or Firm* — Seed Intellectual Property Law Group LLP

(57) ABSTRACT

A semiconductor module includes a first semiconductor die, which comprises (i) a power support structure and (ii) a first cache region; and a second semiconductor die, which is mounted on top of the first semiconductor die and comprises (i) a logic core, which overlies and is electrically connected to the power support structure, and (ii) a second cache region, which overlies and is electrically connected to the first cache region.

10 Claims, 7 Drawing Sheets

(56) References Cited

U.S. PATENT DOCUMENTS

| | | | | |
|---|---|---|---|---|
| 12,489,032 | B2 * | 12/2025 | Eid | H10W 40/47 |
| 2026/0100228 | A1 * | 4/2026 | Joshua | G11C 16/10 |

OTHER PUBLICATIONS

Burton et al. "FIVR—Fully integrated voltage regulators on 4th generation Intel® Core™ SoCs", 2014 IEEE Applied Power Electronics Conference and Exposition—APEC 2014, Mar. 16-20, 2014, 8 pages.

Mujtaba Hassan. "AMD Discloses Its Multi-Layer Chiplet Design Era, Starting With Zen 3 With 3D Stacked V-Cache Technology", Hardware/Hot Chips, Aug. 22, 2021, 5 pages.

Lin et al. "Backside Power Delivery with a Direct 14:1/19:1 High-Ratio Point-of-Load Power Converter for Servers and Datacenters", 2021 Symposium on VLSI Technology, Jun. 13-19, 2021, 2 pages.

* cited by examiner

STACKED 3D CACHE CONFIGURATION WITH ON-CHIP POWER SUPPORT

BACKGROUND

The present invention relates to the electrical, electronic, and computer arts, and more specifically, to integrated circuits and their fabrication.

Integrated circuits typically operate at the lowest possible switching voltage, so as to minimize dynamic power and $I^2R$ losses in the transistors and connecting metal. However, power is transmitted to the integrated circuits at high voltage. Accordingly, in an integrated circuit, step-down voltage conversion typically occurs in several steps between a power source and the transistors. The power not lost in voltage conversion is spent in operation of the logic and memory circuits.

SUMMARY

Principles of the invention provide techniques for a stacked 3D (three-dimensional) cache configuration with on-chip power support.

In one aspect, an exemplary semiconductor module includes a first semiconductor die, which comprises (i) a power support structure and (ii) a first cache region; and a second semiconductor die, which is mounted on top of the first semiconductor die and comprises (i) a logic core, which overlies and is electrically connected to the power support structure, and (ii) a second cache region, which overlies and is electrically connected to the first cache region.

According to another aspect, an exemplary semiconductor module includes a first semiconductor die that embodies a logic core; a second semiconductor die that embodies a cache memory; and a third semiconductor die that embodies a power support structure. The second semiconductor die is attached to the first semiconductor die with a device side of the second semiconductor die facing a device side of the first semiconductor die. The third semiconductor die is mounted to the first semiconductor die with an interconnect side of the third semiconductor die facing the device side of the first semiconductor die.

According to another aspect, an exemplary method includes fabricating a first semiconductor die, which comprises (i) a power support structure; fabricating a second semiconductor die, which comprises (i) a logic core; optionally, mounting the first semiconductor die onto a module; and mounting the second semiconductor die onto the first semiconductor die, with the logic core overlying and electrically connected to the power support structure.

According to another aspect, an exemplary method includes fabricating a first semiconductor die, which comprises (i) a first cache region; fabricating a second semiconductor die, which comprises (i) a second cache region; mounting the first semiconductor die onto a module; and mounting the second semiconductor die onto the first semiconductor die, with the second cache region overlying and electrically connected to the first cache region.

In view of the foregoing, techniques of the present invention can provide substantial beneficial technical effects. For example, one or more embodiments provide one or more of:

Increased power density compared to conventional arrangements of power support and logic cores.

Increased variety of voltages available to logic core from power support.

Very fine grain power adjustment.

Fast transient response, due to close proximity of regulators to logic cores.

Low inductance between regulators and loads.

Vertical power delivery for enhanced utilization of area on chip.

Increased efficiency of space in chip package.

Some embodiments enable power support and cache to be in different technologies to enable optimal performance for each function, since memory and regulator technology typically differ significantly. Using different technologies, appropriate to each application, has cost and performance benefits. For instance, power devices may require different materials and feature sizes, as well as unique materials for inductors. On the other hand, memory devices can use advanced patterning and are very costly per square millimeter. Efficient fabrication is a general benefit of heterogenous integration.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

At least some embodiments of the invention advantageously provide any one, some, or all of 3D stacked cache memory, on-chip power conversion, a 3D stacked arrangement of circuitry with a logic core on a top chip (adjacent to a heat sink) for improved cooling, and a chip-over-fanout structure.

Figure 1:
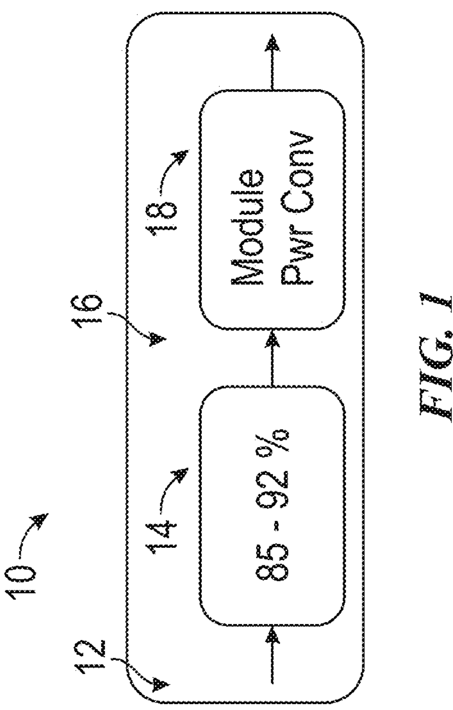
FIG. 1 depicts exemplary power/voltage conversion steps and associated efficiencies from a power source to a logic core of an integrated circuit.

Accordingly, FIG. 1 depicts exemplary steps and associated efficiencies in a power/voltage conversion sequence 10 from a power feed to a logic core of an integrated circuit. At 12, an intermediate bus (12-54 V DC) connects, through a power converter 14 of about 85-92% efficiency, to a module bus 16 that operates at a fixed value between about 1.8 V and about 5 V DC. From the module bus 16, electric current passes through a module power converter 18 to the chips (logic core and cache memory) at 0.5 V to 1.2 V DC. The module power converter 18 has, in a non-limiting example, about 85% efficiency.

Figures 2, 3:
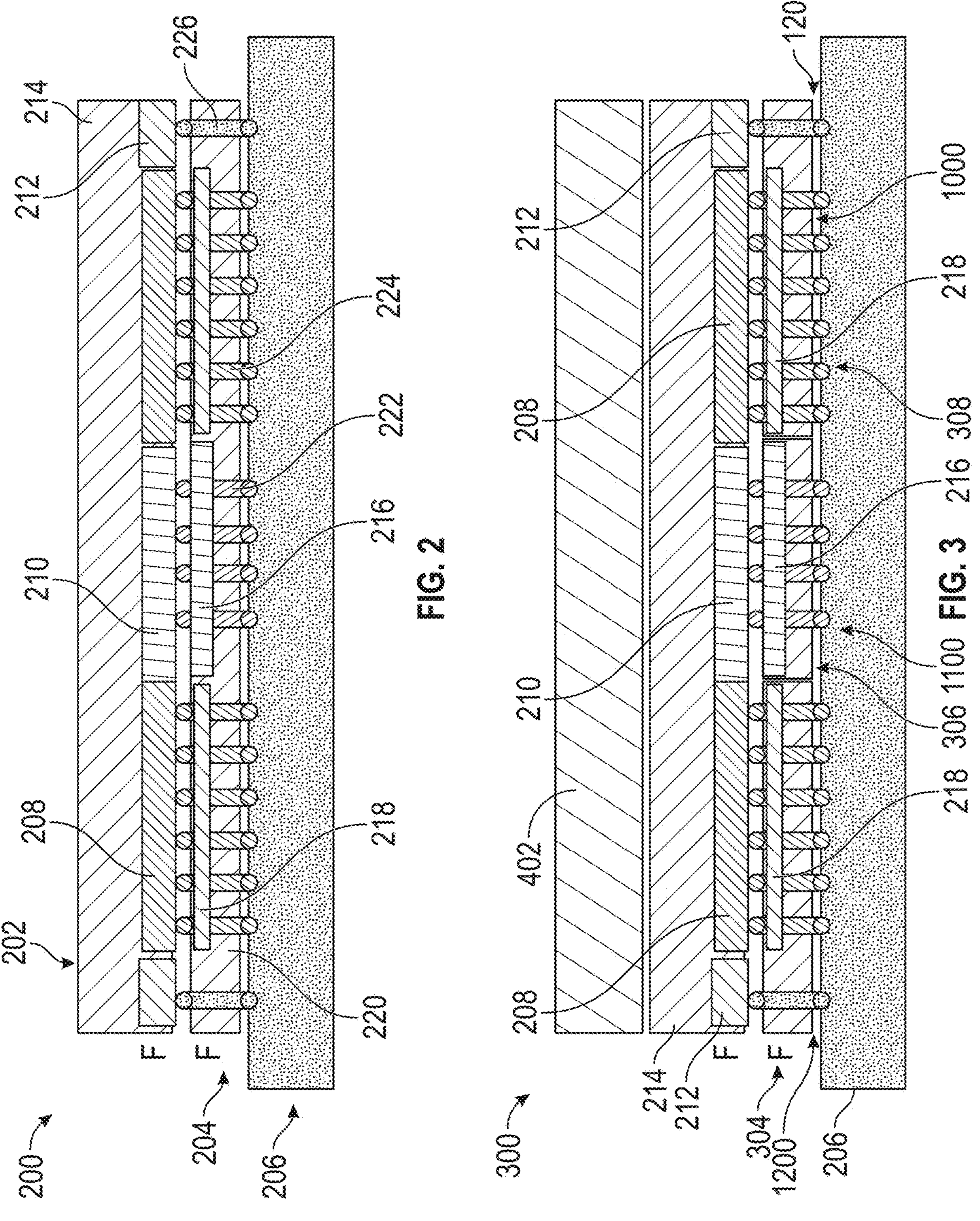
FIG. 2 depicts a logic core-over-power support arrangement of an integrated chip module, in which the power support and cache memory are in the same die.
FIG. 3 depicts a logic core-over-power support arrangement of an integrated chip module, in which the power support and cache memory are in separate adjacent dies.

FIG. 2 depicts a logic core-over-power support arrangement of an integrated chip module 200, in which the power support components 218 and the first cache memory 216 are in the same (first) die 204. The logic cores 208 are in a second (upper) die 202, along with a second cache memory 210 and input/output (I/O) drivers 212. The upper die 202 includes a substrate 214, on which the other components of the die have been built by methods with which the skilled artisan is familiar. The lower die includes a substrate 220, on which the other components of the die have been built by methods with which the skilled artisan is familiar. The two dies 202, 204 are mounted onto a laminate module base 206 with the second die 202 atop the first die 204. The assembled dies 202, 204 form a 3D layer. In one or more embodiments, each die has blind through-silicon vias (TSVs) pre-drilled therein. TSVs 222 electrically connect the caches 210, 216 and TSVs 224 electrically connect the logic cores 208 with the power support components 218. The TSVs provide power to cache 216 for instance, whereby each TSV terminates somewhere in the BEOL of 216. There will be other wiring (not shown), including microbumps or other contacts (e.g., hybrid bond) between 210 and 216, so that 210 can obtain power. Similar structures are provided for the power support and logic cores. Although the abbreviation TSVs typically stands for through-silicon vias, in one or more embodiments there can be through mold vias (TMVs), or passive chiplets with TSV passthroughs, and there can be through dielectric or glass vias as well. In any event, TSVs 226 electrically connect the I/O drivers 212 to the module base 206. The "TSV last" process provides an alternative method/structure to form the TSVs after the two wafers are joined together. It is possible to join multiple dies with blind TSVs to a device wafer, then planarize with molding compound, and finish the TSV reveal and bumping last. In a later assembly step, a heat sink can be added, as shown, for example, in FIG. 4 (discussed below).

In one or more embodiments, the power support components 218 can include thermal sensors, and/or an e-fuse, for load protection. In one or more embodiments, the power support components 218 can include linear/low-dropout (LDO) or other linear regulators for local supply voltage tuning. In one or more embodiments, in a non-limiting example, this enables about 1.2×-1.5× local (in-package) voltage step-down.

In one or more embodiments, the power support components 218 can include magnetic material in back-end-of-line (BEOL) layers. Magnetic material in the power support components 218 can enable building up to 110 MHz inductors. Such inductors can be formed, for example, by depositing highly crystalline magnetic material structures on planar surfaces. The planar surfaces can be formed during chemical-mechanical polishing (CMP) during the fabrication of back end of the line (BEOL) wiring on a wafer. In the inductors, for example, windings (e.g., copper or silver or tungsten) spiral around a flat strip of highly crystalline magnetic material. In one or more embodiments, inductors of 65 to 105 MHz natural frequency are built. In one or more embodiments, the inductors have between about 95 and about 100 MHz natural frequency. As improved magnetic materials are developed, we envision natural frequencies of up to about 110 MHz.

A highly crystalline material is one with few magnetic grain boundaries, in which the majority of the volume of the magnetic material consists of grains with the crystalline structure aligned across grain boundaries. This results in high magnetic moment (high relative magnetic permeability) and low energy loss in the presence of changing fields.

Inductive components can support buck converters or the like. Buck converters can provide a 2:1 or even 4:1 voltage step-down, with less dissipated heat than LDOs. If provided, buck converters can be fabricated entirely in the power support components 218, or partly in the power support components 218 and partly in the logic core 208. On the other hand, building a buck converter entirely in the power support components 218 can enable use of a different (e.g., less-advanced) technology node for the buck converter as compared to the logic core, which economizes fabrication and simplifies design. In this context, "technology node" refers to different semiconductor fabrication feature sizes in the International Technology Roadmap for Semiconductors (2.0), published July 2016. Using a less-advanced technology node is easier to do in case the power support components 218 are disposed on a distinct chiplet, as further discussed with reference to FIG. 3. Indeed, a heterogenous buck converter structure can use a completely different device design, such as planar MOSFETs or trench MOSFETs rather than the nanosheets or fins that are typical of modern logic cores. Further, a separate buck converter can be silicon based or compound semi-conductor based.

It should be noted that, at present, 100 MHz is believed to be the highest frequency where magnetic materials can retain their magnetic (i.e., high relative magnetic permeability) properties. At higher frequencies, air-core inductors are useful, but have much lower inductance. High frequency is desirable, in order to permit the smallest inductance in the circuit. Therefore, in space-constrained applications such as on-chip or on-package voltage converters, the frequency can be run as high as possible, while still being in a region where magnetic materials function. Maximizing the quality (high relative permeability and low loss) of the magnetic material is also appropriate in one or more embodiments.

Generally, a good field effect transistor has 1) low channel drain-to-source on-resistance, 2) low parasitic switching capacitance, and 3) capability to handle the required voltages without the gate oxide breaking down. At low voltages silicon is good. At higher voltages (48 V and higher), SiC and GaN have become more attractive. In the context of 2:1 to 4:1 step-down DC-DC conversion, silicon FETs could be used. For a FET that can handle 3.3 V to 5.0 V, one wishes to have the lowest parasitic capacitance per unit of channel on-resistance. In one or more embodiments, this would be somewhere in the 14 nm to 45 nm technology node, where the standard oxide can still handle 3.3 V plus margin.

Stacking the first and second cache memories 216, 210 is one example of 3D stacked cache memory options, e.g., with cache memory stacked on a bottom chip that overlaps a memory region of a top chip; this can improve efficient use of chip package area to pack in additional logic and memory. Additionally, stacking different parts of the cache means that some parts (e.g., the first or bottom cache 218, which is further from the logic cores 208) can be replaced by lower density emerging memory (e.g., phase change memory (PCM), resistive random access memory (RRAM), magnetoresistive random access memory (MRAM), ferroelectric random access memory (FeRAM))—which may be more suited for a vintage node. Many emerging memories are located in the back-end-of-line (BEOL) and may not need to be implemented in the most advanced access transistors, whereas static random access memory (SRAM) scaling typically uses the most advanced node to scale further. Provision of the power support components 218 beneath the logic cores 208 is an example of on-chip power conversion, which, in one or more embodiments, is a pertinent factor in minimizing $I^2R$ losses and speeding up transient response. In this way, power support functions can be accommodated in otherwise unused area of the bottom chip.

FIG. 3 depicts a logic core-over-power support arrangement of an integrated chip module 300, in which the power support components 218 and first cache memory 216 are in separate adjacent dies 304, 306, 308. In such an embodiment, the power support components and cache can be implemented as chiplets with different technologies on the lower tier. Thus, aspects of the invention provide a chip-over-fanout process/structure, which enables implementation of different technologies (such as BEOL integrated low loss inductors) on chiplets in the lower tier of the stack. This can enhance efficiency of circuit design and fabrication, as less-advanced technology nodes can be used for applications (such as power support components) that do not require small feature sizes achievable with more-advanced and more expensive technology nodes. For example, 5 nm or any advanced node will benefit from shrinking device size for SRAM density. On the other hand, use of the emerging memories can enable incorporation of BEOL devices that require unique processing steps that were not incorporated in the upper die.

Figures 8, 9:
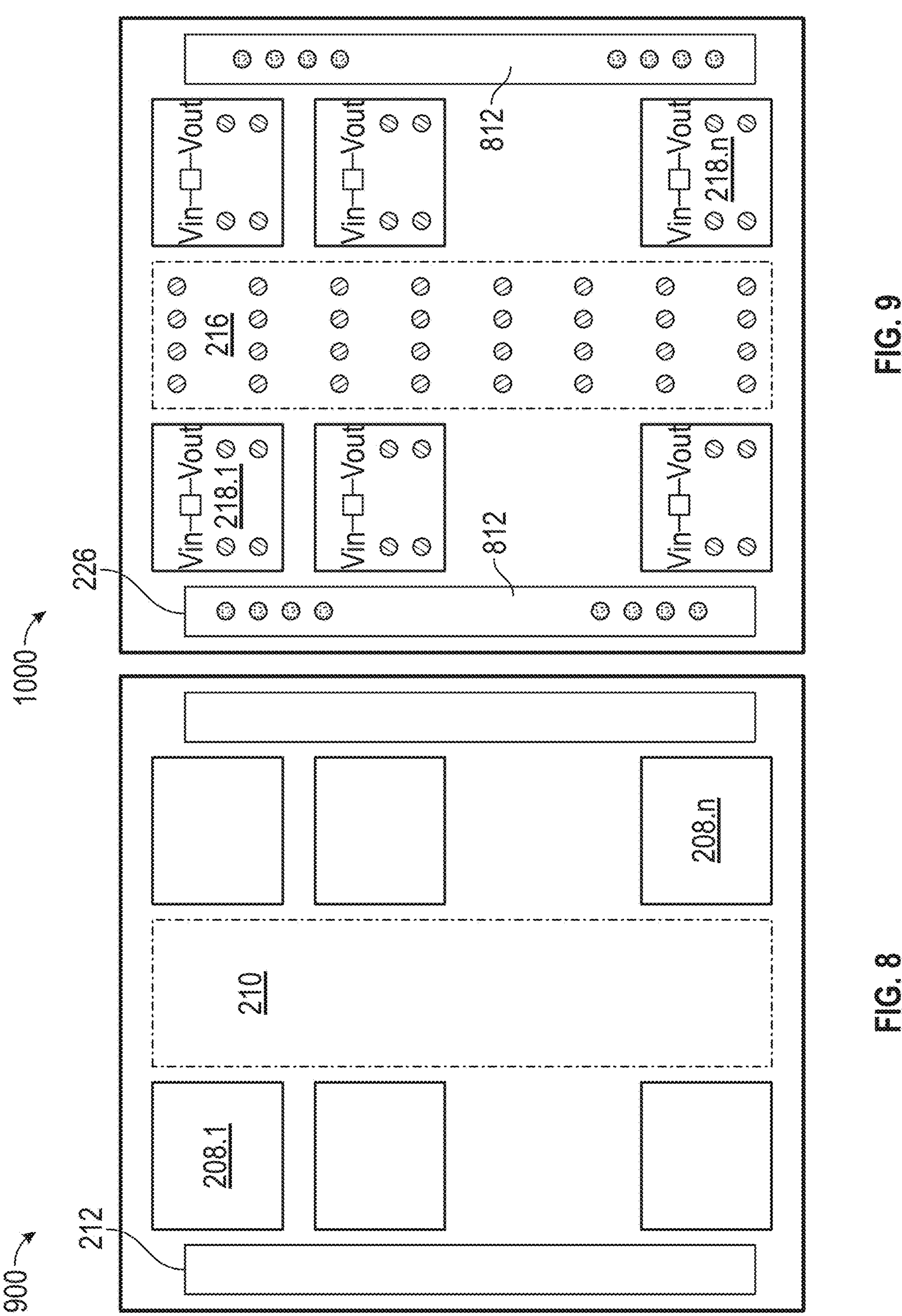
FIG. 8 depicts a layout of a logic core and cache die that is usable in the arrangement of FIG. 7.
FIG. 9 depicts a layout of a cache-and-power support die that is usable in the arrangement of FIG. 7.

In one or more embodiments, the i/o drivers 212 are connected to input/output pins and electrostatic discharge (ESD) protective diodes and resistors 812 in the lower die (as shown in FIG. 9). In one or more embodiments, the i/o drivers 212 are connected to the input/output pins and ESD structures 812 by vias, e.g., TMVs that are formed through a molding compound, or by a passive interconnect die.

Figure 4:
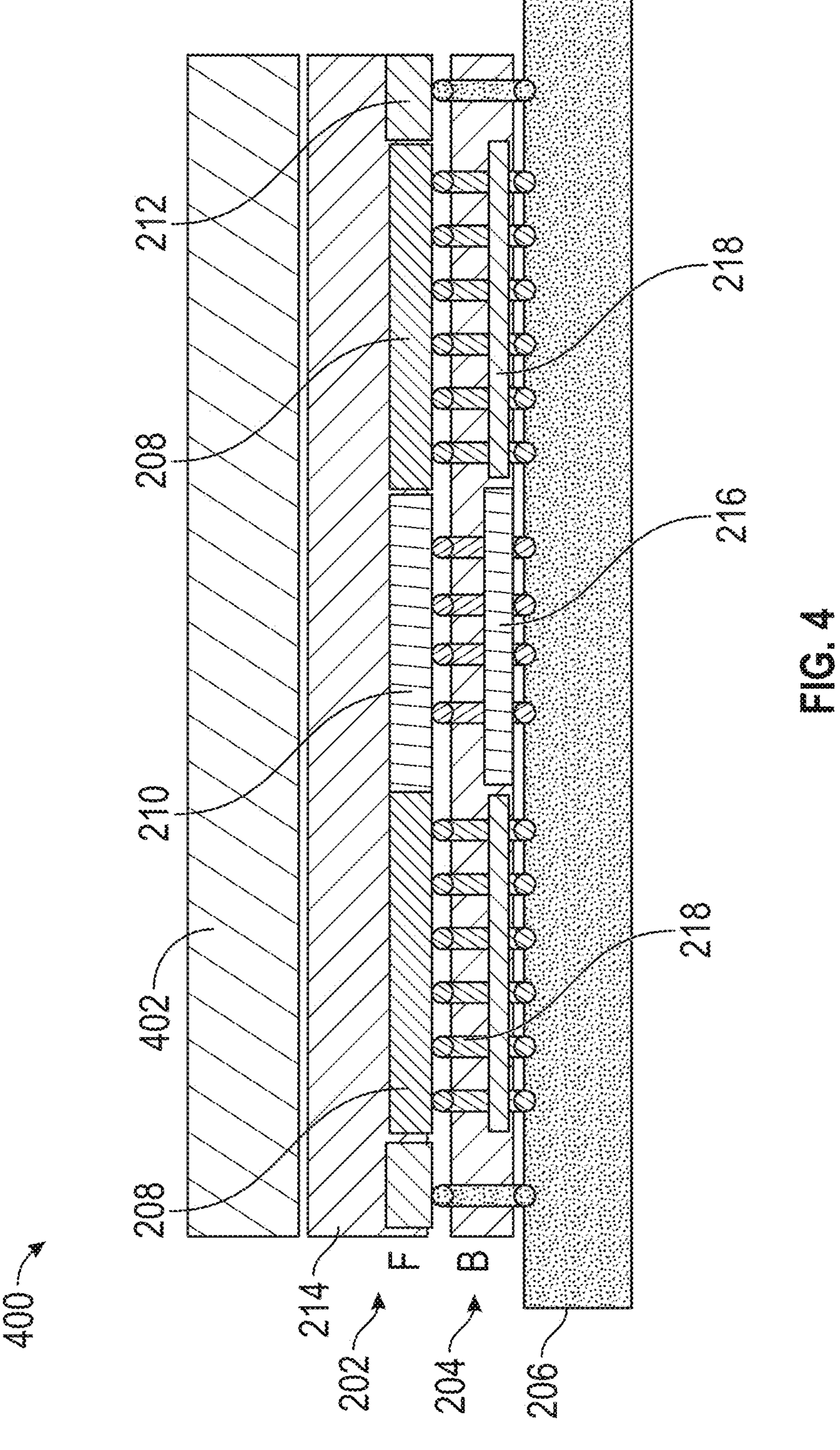
FIG. 4 depicts a face-to-back arrangement of power support and logic core dies in an integrated chip package with a heat sink.

FIG. 4 depicts a face-to-back arrangement of power support die 204 and logic core die 202 (each numbered in FIG. 2) in an integrated chip package 400 with a heat sink 402. Arrangements that put the logic cores 208 closer to the heat sink, as shown in FIG. 4, reduce the thermal resistance and the temperature differential between the logic core and the ambient, thereby increasing the permissible logic core power density, which enables a higher clock rate and more operations in the same chip space. This is advantageous for more-advanced technology nodes (e.g., 5 nm, 3 nm) that have enhanced circuit density and concomitant higher power density.

Figures 5, 6:
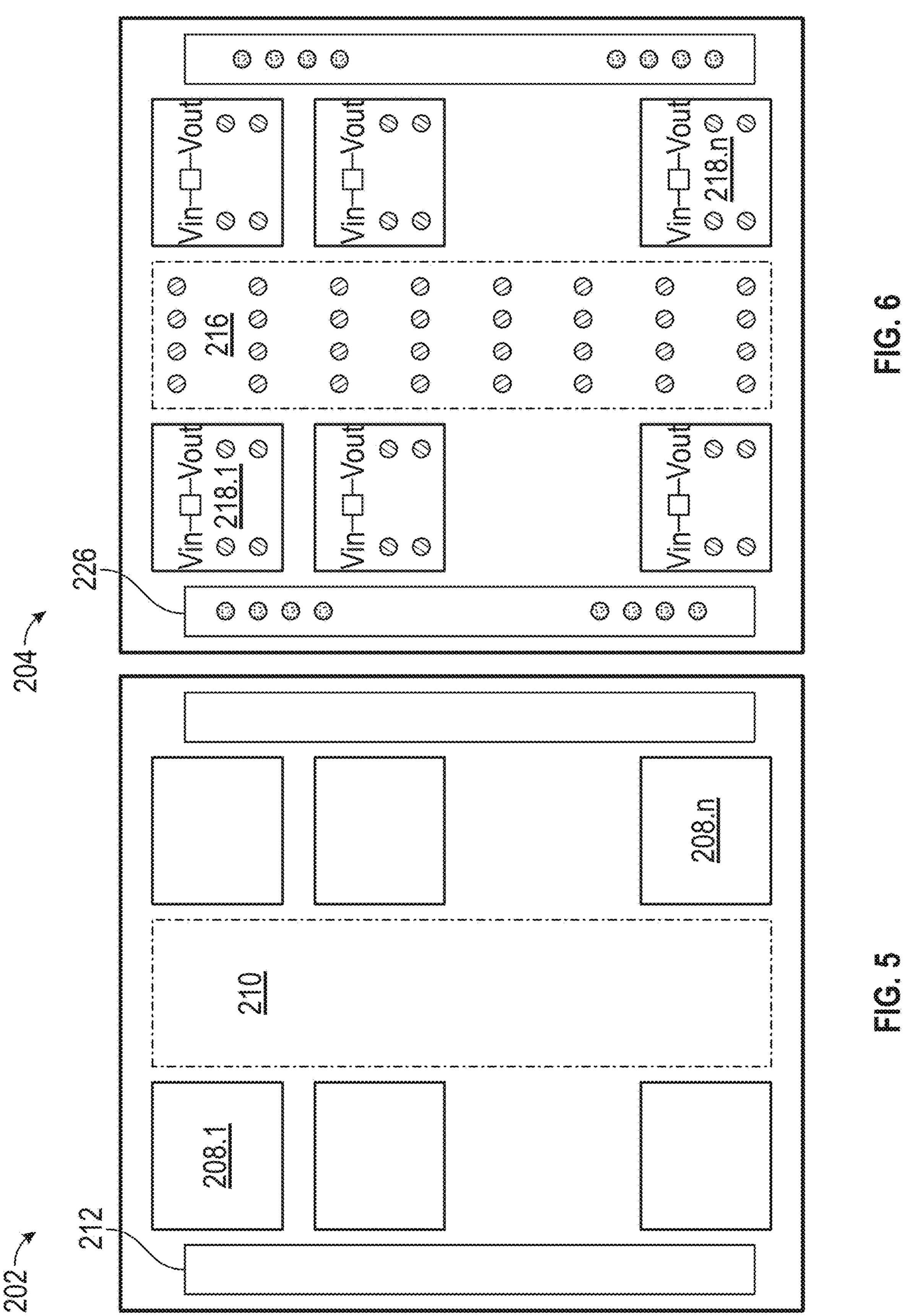
FIG. 5 depicts a layout of a logic core die that is usable in the arrangement of FIG. 4.
FIG. 6 depicts a layout of a cache-and-power support die that is usable in the arrangement of FIG. 4.

FIG. 5 depicts a layout of the logic core die 202 that is usable in the arrangement of FIG. 4. FIG. 6 depicts a layout of the cache-and-power support die 204 that is usable in the arrangement of FIG. 4. As shown in FIG. 4 through FIG. 6, logic cores 208.1, . . . 208.*n* overlay power support components 218.1, . . . 218.*n* while first cache memory 216 underlays second cache memory 210. I/O drivers 212 are provided on logic core die 202. Advantageously, stacking the cache memory 216, 210 brings more memory capacity into a given device footprint, with high bandwidth and low power per bit. Additionally, a stacked cache results in shorter conductors between memory cells, which reduces the communication power cost in the frequently-accessed cache memory, for a number of reasons (e.g., lower ESD requirement, potential for a highly parallel I/O with many communication channels at lower data rate). Similarly, stacking the power support components 218 with the logic cores 208 reduces the length of low-voltage conductors connecting the two components, which also reduces $I^2R$ losses.

Figure 7:
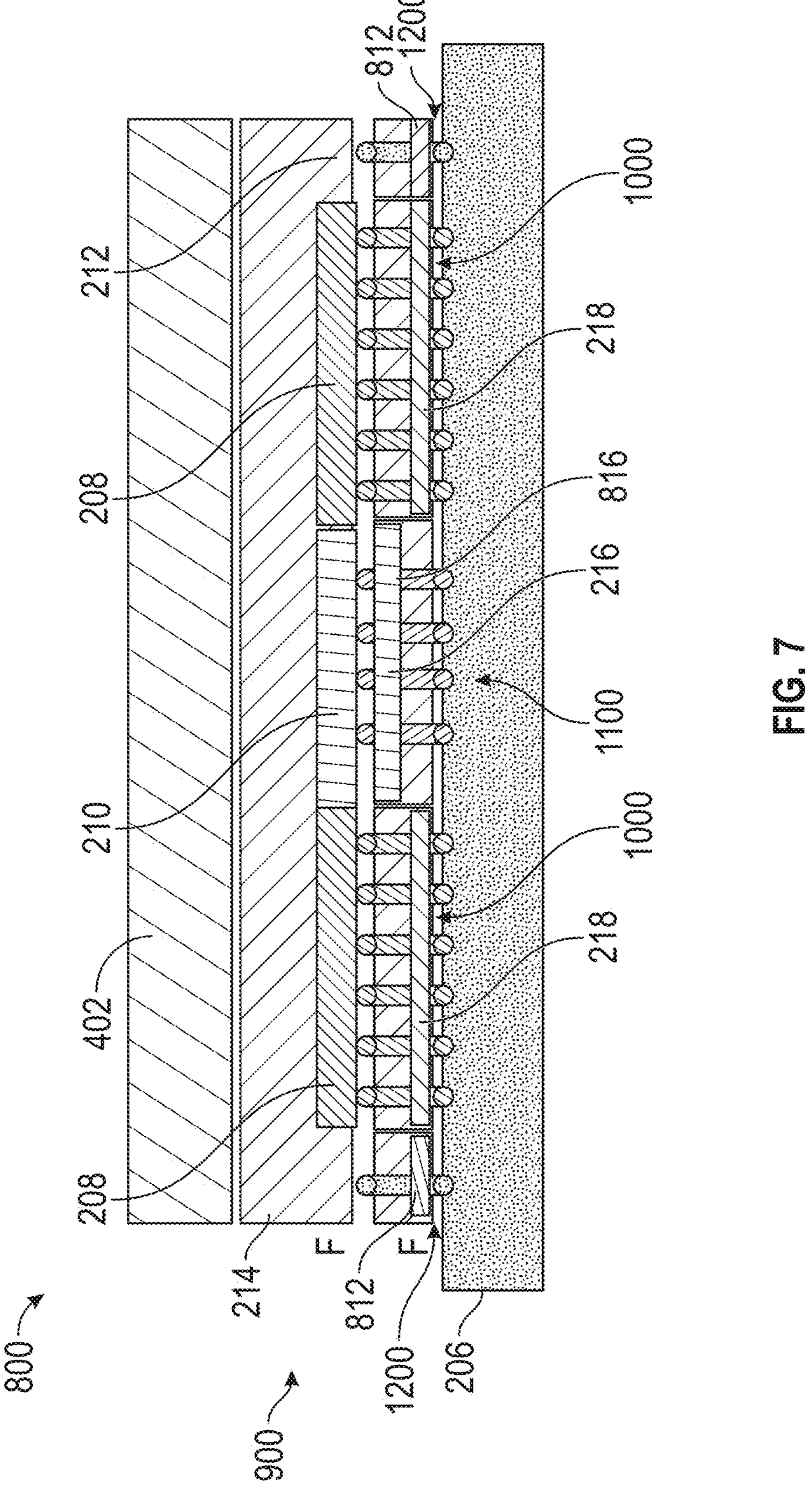
FIG. 7 depicts an arrangement of power support and logic core dies in an integrated chip package with a heat sink, where input/output terminals are in the power support die.

FIG. 7 depicts an arrangement of a power support die 1000, cache memory dice 1100, input/output dice 1200, and a logic core die 900 in an integrated chip package 800 with a heat sink 402. In one or more embodiments, the input/output dice 1200 and the memory dice 1100 are adjacent to the power support die 1000. Depending on technology node choices, it may be advantageous to place the I/O drivers 212 and associated charged device model (CDM) electrostatic discharge (ESD) protective devices on the top chip (logic core die 900), which is made to an advanced node (smaller feature sizes), while placing human body model (HBM) electrostatic discharge (ESD) protection for the I/O 812 on the lower die, which is made to a less-advanced node (larger feature sizes relative to the advanced node), as appropriate, due to the diodes and resistors of the HBM ESD protection 812 not scaling to node. In one or more embodiments, CBM ESD protection also could be provided on the lower die as well as on the upper die. In one or more embodiments, the HBM ESD protection 812 and the power support die 1000 are face-down to advantageously reduce noise at the logic cores, whereas the cache memory 216 in the memory dice 1100 are face-up to advantageously reduce signal length from memory to logic (avoiding TSVs).

FIG. 8 depicts a layout of the logic core die 900 that is usable in the arrangement of FIG. 7. FIG. 9 depicts a layout of the cache-and-power support die 1000 that is usable in the arrangement of FIG. 7. Providing the I/O terminals 812 in the power support die 1000 advantageously makes efficient use of a structure with larger feature sizes for implementing components that do not scale to smaller feature sizes.

In one or more embodiments, providing the power support components 218 beneath the logic core 208 results in approximately doubling the power density (heat dissipation) of the chip package. One way to address this potential issue is by providing through-silicon or through-substrate vias (not shown) in the logic core, which can conduct heat from the power support components 218 directly to the heat sink 402.

Figure 10:
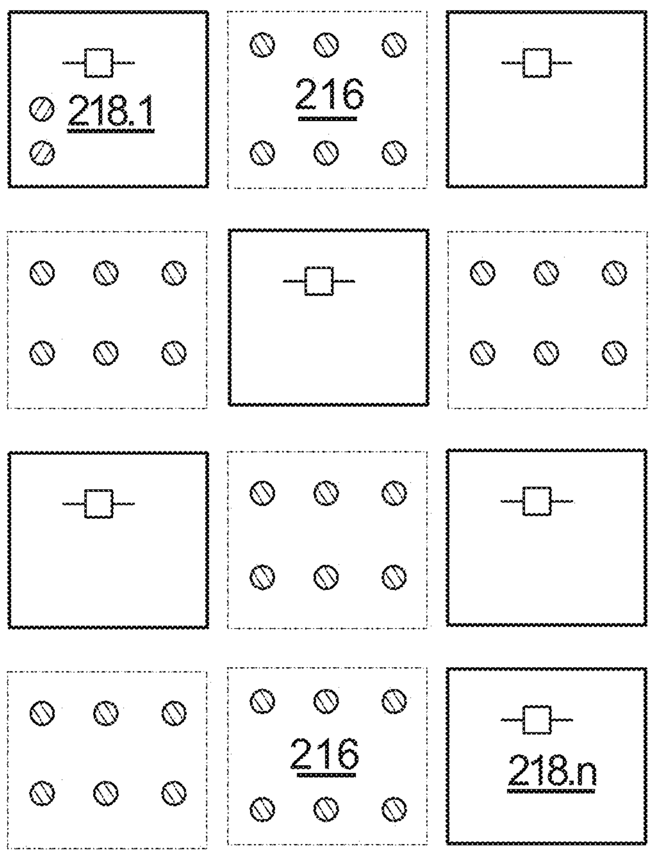
FIG. 10 depicts another layout of a cache-and-power support die, according to exemplary embodiments.

FIG. 10 depicts a "checkerboard" layout of cache memory 216 and power support circuitry 218.1 through 218.*n*. By optimizing connections between the cache memory, the power support circuitry, and the logic cores in an overlying layer, such a layout can improve efficiency of power distribution and latency of memory access, compared to a layout such as is shown in FIG. 8 and FIG. 9.

Given the discussion thus far, it will be appreciated that, in general terms, an exemplary semiconductor module 200 includes a first semiconductor die 204, which comprises (i) a power support structure 218 and (ii) a first cache region 216; and a second semiconductor die 202. The second semiconductor die 202, which is mounted on top of the first semiconductor die, comprises (i) a logic core 208, which overlies and is electrically connected to the power support structure, and (ii) a second cache region 210, which overlies and is electrically connected to the first cache region.

In one or more embodiments, the first semiconductor die embodies a first technology node and the second semiconductor die embodies a second technology node that is different than the first technology node.

In one or more embodiments, the semiconductor module also includes a heat sink 402, which is mounted on top of the second semiconductor die.

In one or more embodiments, the first cache region is adjacent to the power support structure and the second cache region is adjacent to the logic core.

In one or more embodiments, the semiconductor module also includes a third semiconductor die 308, which includes a third cache region. The third semiconductor die is adjacent to the first semiconductor die and the second cache region of the second semiconductor die is adjacent to the logic core and overlies the third cache region.

In one or more embodiments, each of the first, second, and third semiconductor dies embodies a respective, first, second, and third technology node.

In one or more embodiments, the power support structure comprises a through-silicon via that contains a magnetic structure. In one or more embodiments, the power support structure comprises a linear regulator. In one or more embodiments, the power support structure comprises an inductor with a natural frequency of about 65 MHz to about 100 MHz, e.g., a 100 MHz inductor in one or more back end of line layers. In one or more embodiments, the power support structure includes a buck converter.

In one or more embodiments, the first semiconductor die includes an input/output structure that is electrically connected with the logic core in the second semiconductor die.

According to another aspect, an exemplary semiconductor module 800 includes a first semiconductor die 900 that embodies a logic core 208; a second semiconductor die 1100 that embodies a cache memory 216; and a third semiconductor die 1100 that embodies a power support structure 218. The second semiconductor die is attached to the first semiconductor die with a device side of the second semiconductor die facing a device side of the first semiconductor die. The third semiconductor die is mounted to the first semiconductor die with an interconnect side of the third semiconductor die facing the device side of the first semiconductor die.

Typically, interconnect layers are formed during the back-end-of-line steps of a fabrication process, whereas device layers are formed during the front-end-of-line steps.

In one or more embodiments, the module 800 also includes an input/output driver circuit 212 that is embodied in the first semiconductor die, adjacent to the logic core, and that includes charged device model electrostatic discharge protection; input/output vias that are embodied in the third semiconductor die, adjacent to the power support structure; and human body model electrostatic discharge protection 812 that is embodied in the third semiconductor die, adjacent to the input/output vias.

In one or more embodiments, the cache memory includes an emerging memory technology, e.g., one of phase change memory (PCM), resistive random access memory (RRAM), magnetoresistive random access memory (MRAM), and ferroelectric random access memory (FeRAM).

According to another aspect, an exemplary method includes fabricating a first semiconductor die 204, which includes (i) a power support structure 218; fabricating a second semiconductor die 202, which comprises (i) a logic core 208; optionally, mounting the first semiconductor die onto a module 206; and mounting the second semiconductor die onto the first semiconductor die, with the logic core overlying and electrically connected to the power support structure.

In one or more embodiments, the method also includes fabricating the first semiconductor die in a first technology node; and fabricating the second semiconductor die in a second technology node that is different than the first technology node.

In one or more embodiments, the method also includes fabricating a buck converter as part of the power support structure.

In one or more embodiments, the method also includes fabricating a through-silicon via that contains a high crystalline magnetic material as part of the power support structure.

In one or more embodiments, the method also includes fabricating a first cache 216 as part of the first semiconductor die 204; fabricating a second cache 210 as part of the second semiconductor die 202; and mounting the second semiconductor die onto the first semiconductor die so that the second cache overlies the first cache, and the logic core overlies the power support structure.

According to another aspect, an exemplary method includes fabricating a first semiconductor die 204, which comprises (i) a first cache region 216; fabricating a second semiconductor die 202, which comprises (i) a second cache region 210; mounting the first semiconductor die onto a module 206; and mounting the second semiconductor die onto the first semiconductor die, with the second cache region overlying and electrically connected to the first cache region.

In one or more embodiments, the method also includes fabricating the first semiconductor die in a first technology node; and fabricating the second semiconductor die in a second technology node that is different than the first technology node. In one or more embodiments, the method also includes fabricating the first cache as an emerging memory technology (non-limiting examples include: phase change memory (PCM), resistive random access memory (RRAM), magnetoresistive random access memory (MRAM), and ferroelectric random access memory (FeRAM)). In one or more embodiments, the emerging memory technology is selected from the list consisting of: phase change memory (PCM), resistive random access memory (RRAM), magnetoresistive random access memory (MRAM), ferroelectric random access memory (FeRAM) (i.e., in some cases, the emerging memory technology is limited to one or more of those specific types).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. For example, "overlies" and "overlying" means vertically adjacent to and entirely or partly overlapping horizontally. Similarly, "adjacent" can mean directly adjacent or separated by one or more intervening layers or components. Likewise, "connected" can mean directly connected or connected by one or more intervening components.

What is claimed is:

1. A semiconductor module comprising:

a first semiconductor die, which comprises (i) a power support structure and (ii) a first cache region; and a second semiconductor die, which is mounted on top of the first semiconductor die and comprises (i) a logic core, which overlies and is electrically connected to the power support structure, and (ii) a second cache region, which overlies and is electrically connected to the first cache region.

2. The semiconductor module of claim 1, wherein the first semiconductor die embodies a first technology node and the second semiconductor die embodies a second technology node that is different than the first technology node.

3. The semiconductor module of claim 1, further comprising: a heat sink, which is mounted on top of the second semiconductor die.

4. The semiconductor module of claim 1, wherein the first cache region is adjacent to the power support structure and the second cache region is adjacent to the logic core.

5. The semiconductor module of claim 1, wherein the power support structure comprises a magnetic structure.

6. The semiconductor module of claim 1, wherein the power support structure comprises a linear regulator.

7. The semiconductor module of claim 1, wherein the power support structure comprises an inductor with a natural frequency of about 65 MHz to about 100 MHz.

8. The semiconductor module of claim 1, wherein the power support structure comprises a 100 MHz inductor in one or more back end of line layers.

9. The semiconductor module of claim 1, wherein the power support structure comprises a buck converter.

10. The semiconductor module of claim 1, wherein the first semiconductor die comprises an input/output structure that is electrically connected with the logic core in the second semiconductor die.

* * * * *